(12) United States Patent
Zhang et al.

(10) Patent No.: US 7,276,440 B2
(45) Date of Patent: Oct. 2, 2007

(54) METHOD OF FABRICATION OF A DIE OXIDE RING

(75) Inventors: Fan Zhang, Singapore (SG); Bei Chao Zhang, Singapore (SG); Wuping Liu, Singapore (SG); Kho Liep Chok, Singapore (SG); Liang Choo Hsia, Singapore (SG); Tae Jong Lee, Singapore (SG); Juan Boon Tan, Singapore (SG); Xian Bin Wang, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 321 days.

(21) Appl. No.: 10/734,423

(22) Filed: Dec. 12, 2003

(65) Prior Publication Data

US 2005/0127495 A1 Jun. 16, 2005

(51) Int. Cl.
*H01L 23/04* (2006.01)
(52) U.S. Cl. ........................ 438/629; 257/700
(58) Field of Classification Search ............. None
See application file for complete search history.

(56) References Cited

U.S. PATENT DOCUMENTS

| | | | |
|---|---|---|---|
| 5,776,826 A | 7/1998 | Mitwalsky et al. | 438/622 |
| 6,107,161 A | 8/2000 | Kitaguro et al. | 438/462 |
| 6,365,958 B1 * | 4/2002 | Ibnabdeljalil et al. | 257/620 |
| 6,448,113 B2 * | 9/2002 | Lee et al. | 438/132 |
| 6,509,622 B1 | 1/2003 | Ma et al. | 257/483 |
| 6,596,562 B1 | 7/2003 | Maiz | 438/113 |
| 6,992,392 B2 * | 1/2006 | Mori | 257/758 |

* cited by examiner

*Primary Examiner*—Leonardo Andujar

(57) ABSTRACT

In accordance with the objectives of the invention a new design and method for the implementation thereof is provided in the form of an "oxide ring". A conventional die is provided with a guard ring or sealing ring, which surrounds and isolates the active surface area of an individual semiconductor die. The "oxide ring" of the invention surrounds the guard ring or sealing ring and forms in this manner a mechanical stress release buffer between the sawing paths of the die and the active surface area of the singulated individual semiconductor die.

7 Claims, 4 Drawing Sheets

METHOD OF FABRICATION OF A DIE OXIDE RING

BACKGROUND OF THE INVENTION (1) Field of the Invention

The invention relates to the fabrication of integrated circuit devices, and more particularly, to a new design of a die "oxide ring" and a method for the fabrication of this oxide ring.

(2) Description of the Prior Art

Cost-competitive pressures require that semiconductor devices are created at a minimum cost, which results in numerous semiconductor devices simultaneously being created over a substrate.

After the semiconductor devices have been created over a substrate, independent operational units, also known as semiconductor die, are created by singulating or separating the substrate into individual units. This latter process is known as die dicing, a process that is frequently performed by sawing the die along die sawing paths that have for this purpose been provided between and surrounding the individual semiconductor die.

Since a sawing process tends to be a rather abrasive process, it is to be expected that the process is prone to cause die failures and can therefore be a leading yield detractor.

Increased performance of semiconductor devices is in more advanced semiconductor devices among others achieved by incorporating low-k dielectric as insulating materials and copper as interconnect metal into the design and creation of the semiconductor devices.

Low-k dielectric materials present a challenge in view of their high porosity, which leads to easy absorption of moisture by the low-k dielectric, and their low internal stress tolerance, which leads to cracking or the development of fissures if mechanical stress is exerted on the low-k dielectric.

It can readily be expected that, in singulating semiconductor die into individual units, the low-k dielectric is most prone to disruptions, such as cracking, in the corners of the singulated die which are formed by intersections of the sawing paths. The cracking, which originates in the corners of the singulated die, readily extends from the corners across the surface of the die, which in turn leads to potentially placing stress on and even interrupting conductive interconnects, comprising for instance copper, that form part of the singulated die.

In view of the complexity of a high-performance semiconductor die and the there-with associated complexity of the elements that constitute the semiconductor die, a detailed stress analysis for improved understanding of the cracking of low-k dielectric is not readily achieved.

A number of observations can however be made that point towards reasons for the cracking of the low-k dielectric and the thereby introduced negative impact on the complete package of the die.

In a modern, high-performance semiconductor die, it is not uncommon to encounter between 6 and 8 interspersed layers of copper and Inter Metal Dielectric (IMD), thereby including for instance two layers of oxides overlying layers of low-k dielectric. Die passivation is achieved by the deposition of 2 or 3 layers of passivation, thereby including layers of silicon nitride and Undoped Silicon Glass (USG). Brittle, low-k dielectric has a high propensity to crack when subjected to mechanical stress.

It has further been observed that dicing induced cracking most readily occurs when the sawing blade enters the interface between soft but tough copper and hard but brittle CVD low-k dielectric material. It is to be expected that, at these interfaces, the cutting speed may change drastically due to the very different mechanical properties of these materials.

This drastic change in cutting speed readily causes dragging and peeling of the relatively hard but brittle low-k dielectric material. At the time that the sawing blade cuts through the copper interconnect, the copper interconnect may not immediately be cut (and break apart) due to the high tensile toughness of the copper.

It is in this scenario reasonable to expect that the copper, at the time that the copper is being cut, exerts a mechanical force or pull on the surrounding low-k dielectric, thereby moving or deforming the surrounding low-k dielectric. In view of the fact that the low-k dielectrics, which are frequently used for high-performance, advanced semiconductor devices, comprise CVD oxides which are relatively brittle, it stands to reason that peeling, along different dielectrics and along dielectric to copper interfaces, and cracking of the low-k dielectrics is difficult to avoid when singulating a substrate into individual die. This peeling and cracking has been observed, as previously stated, to be most prominent at corners of the singulated die, where the X and Y directions of the sawing paths intersect.

The invention addresses the above highlighted concerns of damage introduced to a semiconductor die by the process of die singulation.

U.S. Pat. No. 5,776,826 (Mitwalsky et al.) describes a fuse etch to form a crack stop to prevent cracks from propagating during dicing.

U.S. Pat. No. 6,509,622 (Ma et al.) discloses a plurality of metal guard rings to prevent cracks.

U.S. Pat. No. 6,596,562 (Maiz) teaches using a laser gun to form trenches between guard rings to isolate the saw from the integrated circuits.

U.S. Pat. No. 6,107,161 (Kitaguro et al.) shows forming cutting grooves outside of the guard ring to prevent cracking during dicing.

SUMMARY OF THE INVENTION

A principal objective of the invention is to provide a design and a method for the creation thereof that improves the process of wafer dicing.

Another objective of the invention is to provide a design and a method for the creation thereof that reduces negative impacts of sawing a semiconductor wafer into individual die.

Yet another objective of the invention is to provide a design and a method for the creation thereof that reduces the occurrence of cracking and fissures in layers of dielectric during the process of sawing a semiconductor wafer into individual die.

In accordance with the objectives of the invention a new design and method for the implementation thereof is provided in the form of an "oxide ring". A conventional die is provided with a guard ring or sealing ring, which surrounds and isolates the active surface area of an individual semiconductor die. The "oxide ring" of the invention surrounds the guard ring or sealing ring and forms in this manner a mechanical stress release buffer between the sawing paths of the die and the surface area of the singulated individual semiconductor die.

DESCRIPTION OF THE PREFERRED EMBODIMENTS

Figure 1:
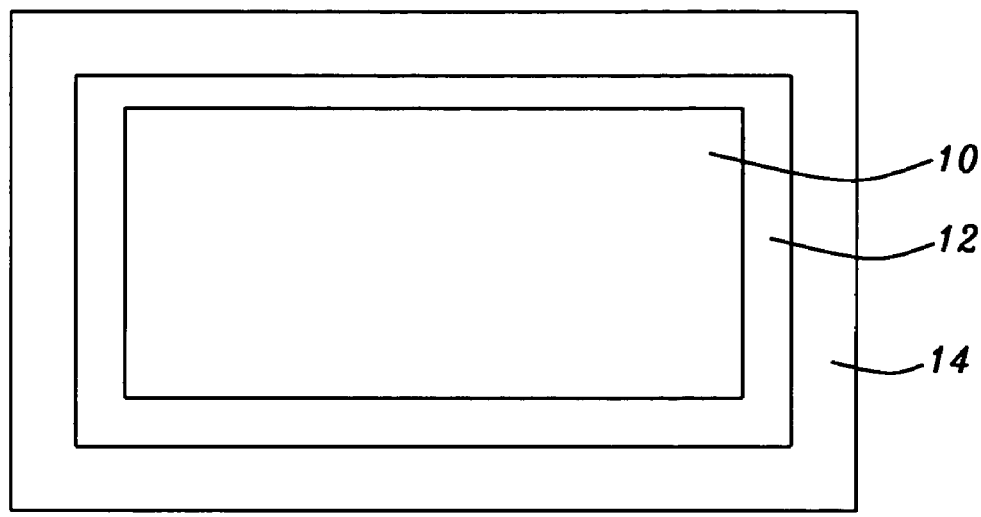
FIG. 1 shows a top view of the oxide ring of the invention, surrounding the conventional guard ring.

To further emphasize the above stated concerns and issues relating to wafer dicing, it must be pointed out that wafer induced cracking can readily propagate during the process of assembling the singulated die at the time that molding compound is applied to the assembled die and cured.

During mechanical-thermal stress, the created free space in the cracking areas will allow more movement of the molding compound at the interface and in this manner apply additional stress to the exposed low-k dielectric and the applied layers of passivation. This additional stress may destroy the integrity of the conductive interconnects by the propagation of the initial cracks and fissures.

The highlighted issues induced by wafer dicing equally apply to flip-chips. Particularly for flip-chips, underfill is required to fill the gap between the silicon die and the device supporting surface such as a flip-chip supporting substrate. In this package and under conditions of thermal-mechanical stress, the entire package may warp, resulting in very high stress exerted on the corners of the mounted die. For such packages and due to the stress-related characteristics of low-k dielectric materials that have previously been highlighted, IMD delamination and cracking is a frequently observed occurrence.

The invention provides a new design of an "oxide ring" around the perimeter of a conventional die and surrounding the conventionally provided guard ring or sealing ring of the semiconductor die. This is shown in top view in FIG. 1, where are highlighted the active surface area 10 of the semiconductor die, which may for instance comprise a SRAM device arrangement, the conventional guard ring 12 and the oxide ring 14 of the invention.

Any activity of dicing the die will take place outside or within the boundaries of the oxide ring 14 and will therefore, as far as transfer of mechanical or thermal stress into the die is concerned, be isolated from the die by the oxide ring 14. From this it stands to reason that the previously highlighted negative effects of low-k dielectric cracking, the development of fissures or peeling and the secondary effects that these negative effects may have on conductive interconnects of the die, are as a minimum reduced and are potentially prevented.

The oxide ring 14 is preferred to comprise a stack of oxide trenches, in which a single type oxide is used to fill a trench surrounding the guard ring 12 from the first level of metal (M1) to the surface of the die.

In applications where there are a relatively large number of layers of metal, the creation of the oxide ring may be performed in more that one step of etching the trench therefore.

For instance, for an arrangement where three levels of metal are being created as part of the die, the trench for the oxide ring may be etched and filled after deposition of the layers of dielectric and intervening layers of etch stop material but prior to completion of all three levels of metal. If more levels of metal are required, this process may be repeated, creating an oxide ring that surrounds and buffers all levels of metal. This will be further explained using FIGS. 2 through 6 for this purpose.

Having highlighted the design of the oxide ring of the invention by using FIG. 1, the process for the creation of the oxide ring of the invention will now be further explained using FIGS. 2 through 6.

Figure 2:
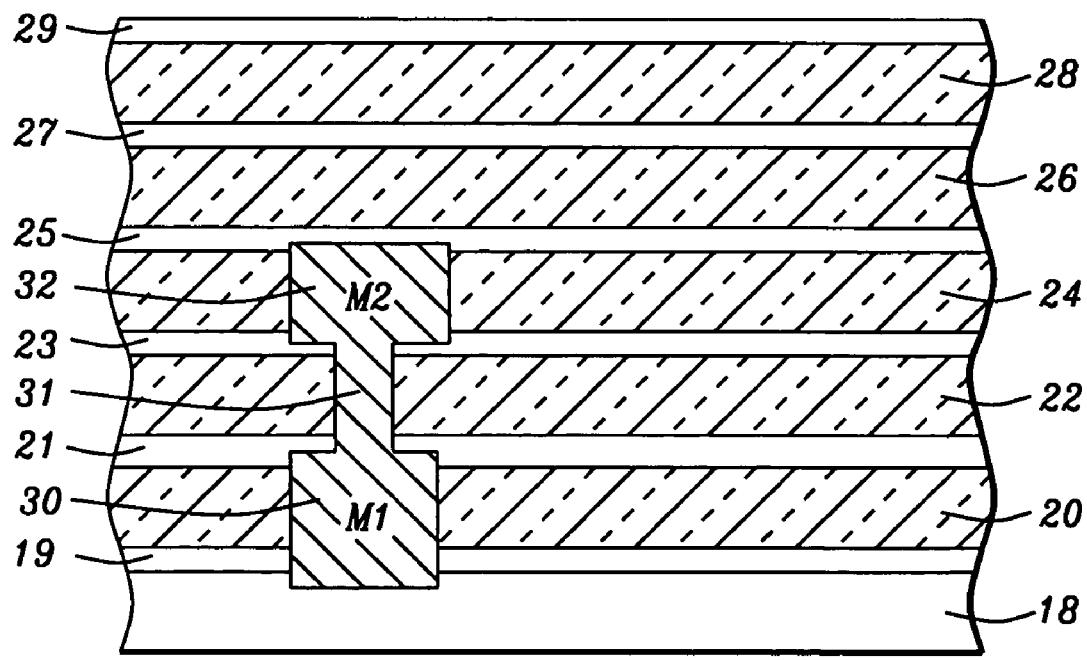
FIG. 2 shows a cross section of a stack of layers of dielectric, separated by layers of etch stop material, through which two levels of metal have been created.

Referring specifically to FIG. 2, there is shown a stack of layers of dielectric with interposing layers of etch stop material. The stack of layers of dielectric shown in the cross section of FIG. 2 is the stack that is required for the creation of three layers of metal, M1 through M3.

The metal interconnects of FIGS. 2 through 6 are created over a surface 18, which preferably is the surface of a semiconductor wafer but is not limited thereto.

Surface 18 may be a semiconductor substrate, a metallized substrate, a glass substrate and a semiconductor device mounting support.

The semiconductor substrate may be a ceramic substrate, a glass substrate, a gallium arsenide substrate, a silicon substrate comprising a single layer of material, such as a silicon wafer or comprising silicon on insulator (SOI) technology and silicon on sapphire (SOS) technology, a doped or undoped semiconductor, an epitaxial layer of silicon supported by a base semiconductor, a sapphire substrate or a substrate used for flat panel displays.

The layers of dielectric shown in the cross section of FIG. 2 have been highlighted with the even numbers from 20 through and including 28, the layers of etch stop material shown in the cross section of FIG. 2 have been highlighted with the uneven numbers from 19 through and including 29.

Layers 20–29 and 19–29 serve the conventional purpose of layers of insulation and etch stop material that are applied for the creation of layers of interconnect metal therein and there-over. The layers of dielectric numbered in even numbers from 20 through 28 are preferred to comprise a low-k dielectric material.

In the cross section that is shown in FIG. 2, two levels of metal have been created, highlighted as the first level of metal (M1) 30 and the second level of metal (M2) connected by a first interconnect via 31.

Figure 3:
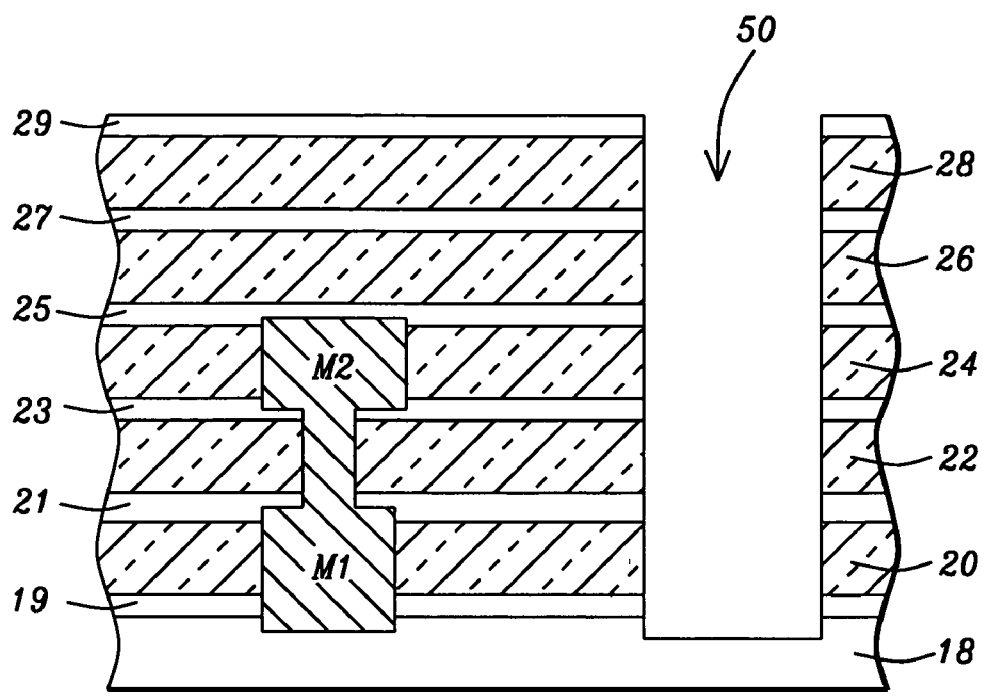
FIG. 3 shows a cross section after a trench has been etched for the creation of the oxide ring of the invention.

The levels of interconnect metal have been completed to level M2, and not to the final required level of M3, since, as shown in the cross section of FIG. 3, it is considered preferable to at this time, that is after creation of M1 and M2 with a corresponding interconnect via, the trench 50, shown in cross section in FIG. 3, is etched through the even numbered levers 20–28 of low-k dielectric and the uneven number layers 19 through 29 of etch stop material.

The preferred method for the creation of the oxide ring trench 50 is a fuse-etch.

Figure 4:
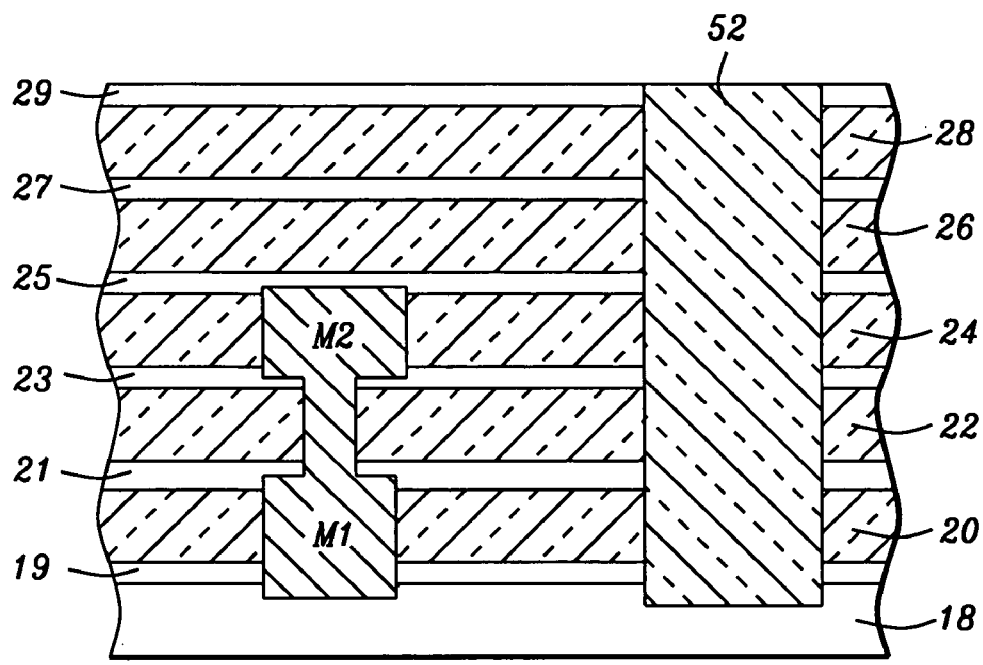
FIG. 4 shows a cross section after the trench for the oxide ring of the invention has been filled with oxide and planarized.
Figure 5:
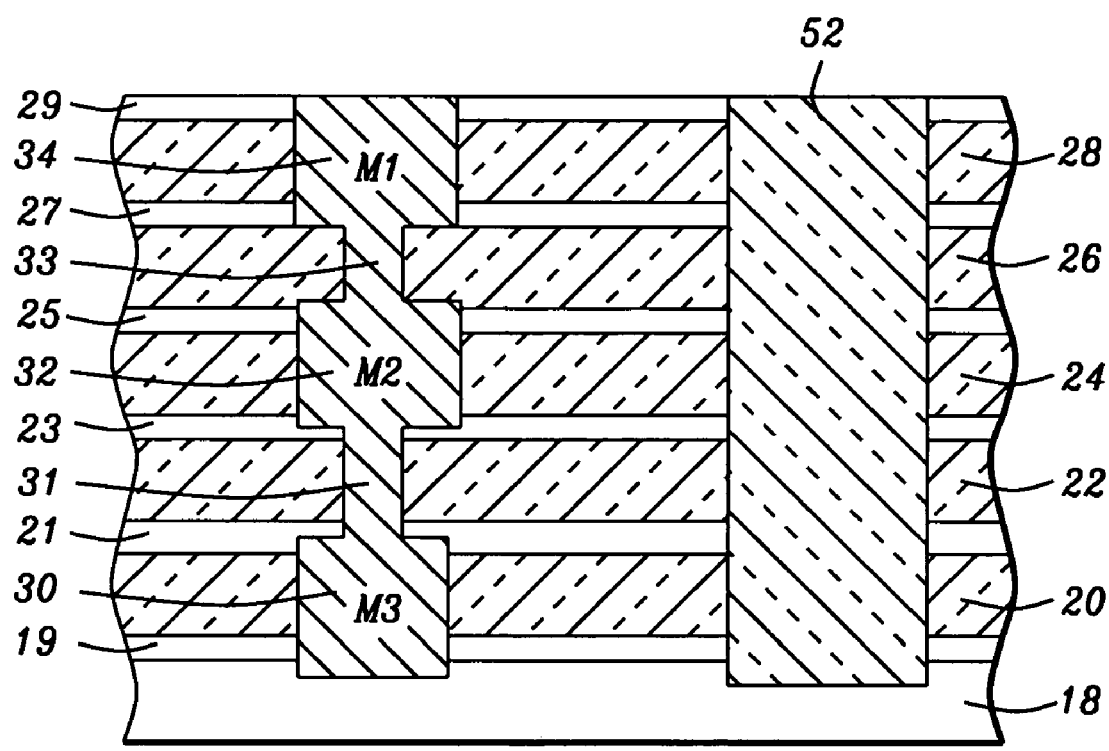
FIG. 5 shows a cross section after three level of metal have been completed.

The oxide ring trench is now, as shown in the cross section of FIG. 4, filled with oxide, such as USG or any other material that is not prone to cracking or to the occurrence of fissures when subjected to thermal-mechanical stress. The deposited oxide is planarized down to the surface of the top layer 29 of etch stop, preferably applying methods of Chemical Mechanical Polishing (CMP).

The process of creating the required layers of metal is, after the structure that is shown in the cross section of FIG. 4 has been obtained, continued up to, in the example shown in FIGS. 2 through 5, three layers of metal (M3). Conventional methods of creating conductive interconnects are applied for this purpose, creating the in FIG. 4 highlighted second interconnect via 33 and the third level of metal 34.

Figure 6:
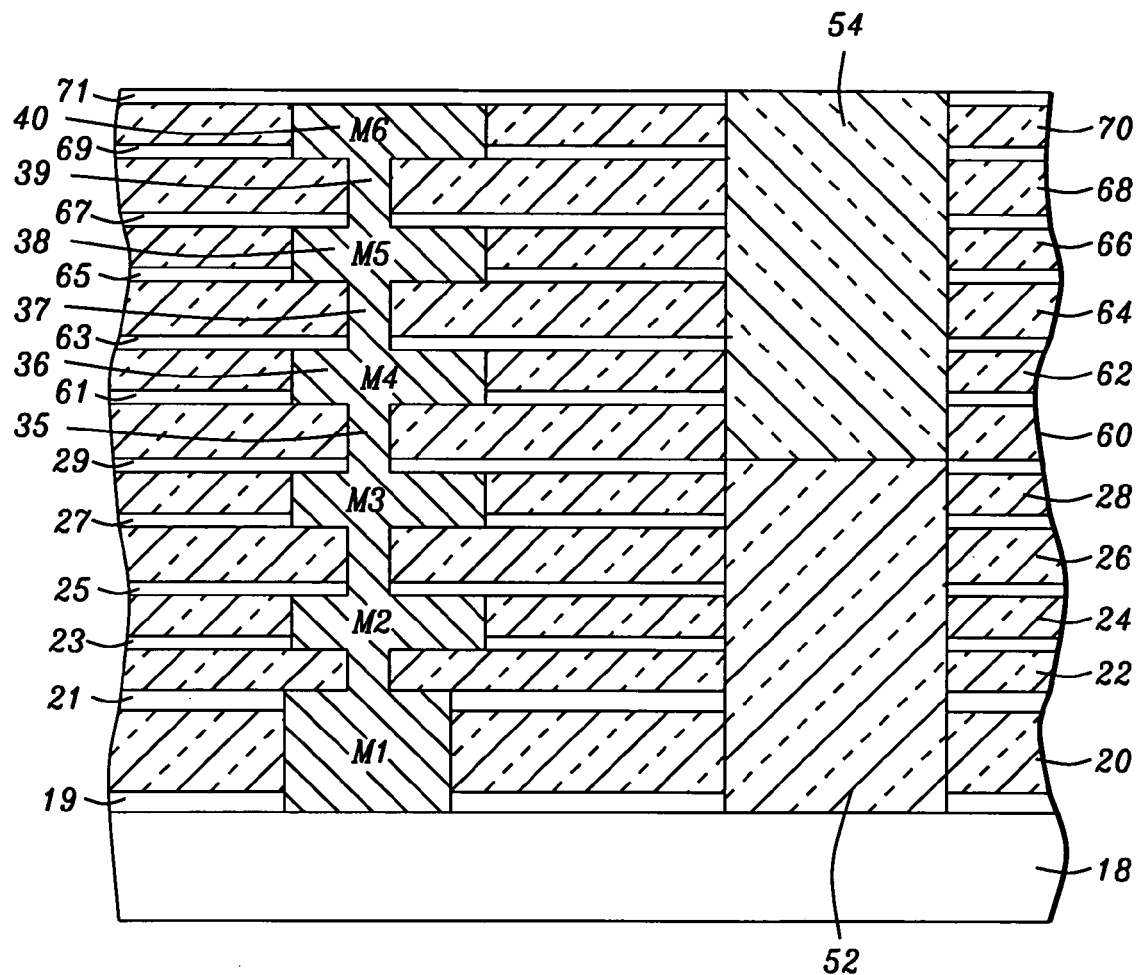
FIG. 6 shows a cross section after additional levels of metal have been completed, for a total of six levels of metal.

For applications where additional layers of interconnect are required, the previously highlighted processing steps are repeated as, by way of example, has been shown in the cross section of FIG. 6. For the cross-section of FIG. 6, a total of six (M6) layers of metal have been shown.

Specifically shown in the cross section of FIG. 6 are the lower and previously discussed and even numbered layers 20–28 of dielectric and the uneven numbered layers 19–29 of etch stop material. Added to these layers are even numbered layers 60–70 of dielectric and uneven numbered layers 61–69 of etch stop material. The highlighted upper layer 71 is a layer of passivation but can equally comprise a layer of etch stop material.

To complete the M6 levels of interconnect metal, uneven numbered interconnect vias 35–39 have been created and even numbered levels 36–40 of metal.

Of significance in the cross section of FIG. 6 is that layer 52 of oxide, forming a first oxide ring, has been created as previously discussed, as part of creating the M3 levels of metal. In similar manner and after completion of the oxide ring 52 and the M3 level of metal, the M4, M5 and M6 levels of metal are created with interconnect vias. The creation of interconnect metal M4, M5 and M6 is interrupted after M5 has been created for the etch for the trench of oxide ring 54. This trench is filled with oxide after which the interconnect via 39 and M6 level of metal is completed.

It is clear that this processing sequence can be repeated for purposes of creating additional levels of interconnect metal with corresponding interconnect vias.

Regarding the oxide ring of the invention, the following must be emphasized:

wafer sawing is, of significance to the invention, to take place on the side of the oxide ring that is opposite to the side of the oxide ring that faces the guard ring and the active surface area of the singulated die wafer sawing may, of further significance to the invention, partially or completely take place through the oxide ring of the invention, thus still allowing the oxide ring of the invention to serve as a stress buffer between the sawing activity and the singulated die the oxide ring of the invention prevents damage to low-k dielectrics and to copper interconnects that form part of the singulated die the oxide ring of the invention serves as a protective buffer during thermal and mechanical stress tests since the oxide ring provides a continuous and, when compared with low-k dielectrics, a stronger mechanical support for the low-k dielectrics and the copper interconnects of the semiconductor die, and when compared with the dense low-k dielectric and copper interconnect traces, the oxide trench has considerably fewer interfaces that can lead to delamination or the occurrence of cracking or the formation of fissures in surrounding layers of low-k dielectric.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for creation of an oxide ring surrounding a guard ring of a semiconductor die, comprising:

providing a substrate comprising semiconductor devices being accessible by points of electrical contact provided in or over the substrate, said semiconductor devices comprising a semiconductor die by being surrounded by a guard ring;

creating at least one level of interconnect metal with corresponding interconnect vias over the substrate aligned with said points of electrical contact; and surrounding the guard ring with an oxide ring comprising a trench filled with an oxide.

2. The method of claim 1, the surrounding the guard ring with an oxide ring comprising a trench filled with an oxide comprising:

performing at least one trench etch, creating at least one trench surrounding the guard ring;

performing at least one oxide deposition, filling the at least one trench; and performing at least one process of Chemical Mechanical Polishing (CMP) for removal of excess oxide.

3. The method of claim 1, the oxide comprising Undoped Silicon Glass (USG).

4. A method for dicing a semiconductor substrate, thereby creating singulated semiconductor die, comprising:

providing a substrate comprising semiconductor devices being accessible by points of electrical contact provided in or over the substrate, said semiconductor devices comprising a semiconductor die by being surrounded by a guard ring, said substrate comprising sawing paths, a lateral surface area being available over the semiconductor die separating the guard ring from the sawing paths;

creating at least one level of interconnect metal with corresponding interconnect vias over the substrate aligned with said points of electrical contact;

creating an oxide ring comprising a trench filled with an oxide over the lateral surface area of the semiconductor die; and singulating the substrate into semiconductor die by sawing along the sawing paths.

5. The method of claim 4, the creating a trench filled with an oxide over the lateral surface area of the semiconductor die comprising:

performing at least one trench etch, creating at least one trench surrounding the guard ring;

performing at least one oxide deposition, filling the at least one trench; and performing at least one process of Chemical Mechanical Polishing (CMP) for removal of excess oxide.

6. The method of claim 4, the oxide comprising Undoped Silicon Glass (USG).

7. The method of claim 4, the singulating the substrate into semiconductor die further comprising sawing through a part of the oxide ring.

\* \* \* \* \*